(12) United States Patent  
Miettinen et al.

(10) Patent No.: US 7,031,161 B2  
(45) Date of Patent: Apr. 18, 2006

(54) COOLING SYSTEM FOR ADJUSTABLE ELECTRIC DRIVE

(75) Inventors: Osmo Miettinen, Vaasa (FI); Timo Koskinen, Vaasa (FI)

(73) Assignee: Vacon Oyj, Vaasa (FI)

( * ) Notice: Subject to any disclaimer, the term of this patent is extended or adjusted under 35 U.S.C. 154(b) by 30 days.

(21) Appl. No.: 10/856,848

(22) Filed: Jun. 1, 2004

(65) Prior Publication Data

US 2005/0018400 A1   Jan. 27, 2005

(30) Foreign Application Priority Data

Jun. 4, 2003   (FI)   ................................. 20030840

(51) Int. Cl.
*H05K 7/20* (2006.01)

(52) U.S. Cl. ...................... 361/704; 361/688; 361/719; 165/80.3; 165/185

(58) Field of Classification Search ........ 361/687–690, 361/697, 699, 704, 719, 727; 257/714; 165/80.4, 165/104.33, 185; 174/15.1
See application file for complete search history.

(56) References Cited

U.S. PATENT DOCUMENTS

| 4,772,999 | A |   | 9/1988 | Fiorina et al. |
| 5,631,821 | A | * | 5/1997 | Muso ........................ 363/141 |
| 5,940,263 | A |   | 8/1999 | Jakoubovitch |
| 6,326,761 | B1 | * | 12/2001 | Tareilus ..................... 318/722 |
| 6,510,053 | B1 | * | 1/2003 | Azar ........................ 361/704 |
| 6,822,866 | B1 | * | 11/2004 | Fearing et al. .............. 361/701 |

\* cited by examiner

*Primary Examiner*—Boris Chérvinsky
(74) *Attorney, Agent, or Firm*—Oliff & Berridge, PLC

(57) ABSTRACT

The invention relates to a cooling arrangement for an adjustable electric drive. The arrangement is arranged to conduct heat generated in electric devices by means of a liquid flowing through the cooling element to the surrounding space. The arrangement comprises a cooling element which is made of aluminum and to which components to be cooled can be fastened, and a base having means for fastening the cooling element. The arrangement is characterized in that the base is made of an aluminum profile that is stiffened and has mounting rails for receiving the cooling element and for preventing the movement of the cooling element transversely to the longitudinal direction of the mounting rails, and the cooling element can be fastened perpendicular to the profile base by using fastening means that support the cooling element so that components can be fastened to the cooling element, whereby the combined base and cooling element serve as a heat-conducting support base of the frequency converter.

4 Claims, 5 Drawing Sheets

COOLING SYSTEM FOR ADJUSTABLE ELECTRIC DRIVE

FIELD OF THE INVENTION

The present invention relates to a cooling solution for adjustable electric drives, especially frequency converters. With this type of arrangement, an electric device is protected by enabling sufficient cooling as needed.

BACKGROUND OF THE INVENTION

The maximum temperature of many devices is exactly defined. Free air circulation is often insufficient and, in such cases, forced cooling is necessary to cool electric devices in a frequency converter.

Earlier, frequency converters have been cooled by fans that transfer cooling replacement air from outside the casing. For instance, publications U.S. Pat. No. 6,091,604; U.S. Pat. No. 5,617,307; and DE 10,103,941 disclose an encased frequency converter that is cooled using airflow produced by a fan.

To ensure sufficient cooling and firmness, complex structures are, however, required, whereby the size of the device increases and serviceability becomes difficult due to a layered structure, as disclosed in U.S. Pat. No. 6,091,604, for instance.

Liquid cooling has been applied to some extent to the cooling of electric devices by using ionized water, for instance. It has then been possible to bring the liquid in contact with electric circuits. When using another liquid, such as ordinary water, the liquid circulation needs to be kept separate from electric circuits, and this has caused problems in positioning the elements.

BRIEF DESCRIPTION OF THE INVENTION

It is an object of the present invention to provide a cooling arrangement for an adjustable electric drive, and especially for a frequency converter, having the properties of improved firmness and cooling.

This is achieved by a cooling arrangement that has the characteristics defined in the claims according to this invention. To be more precise, the arrangement according to this invention is mainly characterized by what is stated in the characterizing part of claim 1.

Preferred embodiments of the invention are disclosed in the dependent claims.

In the arrangement of the invention, a cooling element is fixed to an aluminum profile base and this combination serves as the support base for the entire device. Since the cooling element is fixed to its base, it forms a stable and firm structure that also provides the largest possible surface area and mass for the cooling element without unnecessarily increasing the size of the frequency converter.

The base is made of an aluminum profile which is stiffened and has mounting rails for receiving the cooling element and for preventing the shifting of the cooling element transversely to the longitudinal direction of the mounting rails.

The cooling element is cooled by liquid and is fastened perpendicular to the profile base by using fastening means that support the cooling element so that components can be fastened to the cooling element, whereby the combined base and cooling element serve as a heat-conducting support base structure of the frequency converter.

The cooling element can be positioned upright in the middle of the base. The base is also made of a heat-conducting material, such as aluminum. To improve stiffness, the base is shaped in such a manner that the stiffening is utilized when fastening the cooling element. The cooling element can be fastened between the mounting rails on the base.

It is known that efficient liquid cooling would make possible the use of smaller and more efficient cooling elements. In the invention, the cooling element is, however, made as large as possible by using it as a part of the support base for the frequency converter and by also fastening thereto any parts that do not require as much cooling. Walls between the cooling liquid and electric elements should also be thick enough to endure the loads and possible damage directed to the wall. Since the cooling element is made of aluminum, its thickness can be increased without considerably increasing the total weight of the entire device. A massive aluminum frame is not susceptible to vibration, so the components fastened to the cooling frame can be fastened firmly and vibration-tolerantly to the frame.

Both the cooling element and the base are made of a heat-conducting material, such as aluminum. The base and the mounting rails arranged thereto adapt closely to the cooling element and this closeness also allows heat to transmit from the cooling element to the base thus also making the base serve as an extension part for the cooling element.

Because operating sites and conditions vary, the need for cooling varies in different elements. It is then also necessary to cool some parts more than others. It is known that efficient cooling makes it possible to use higher frequency converter power, so directing cooling to the critical points is important. By using the cooling element as a frame and by directing the cooling flow inside it especially to critical points provides considerable advantages.

In addition, a large cooling element enables the positioning of the components so as to make service or repairs easy. Because the cooling surface is extensive, it is also possible to vary the location of the elements of the frequency converter more freely, i.e. the components can be placed easily accessible so as to make installation and repairs easy and quick.

It should be noted that the cooling element can have sufficient mass to cool small frequency converters. On the other hand, when the operating environment prevents the use of liquid cooling, a conventional cooling element, such as a cooling fin, can easily be fastened on one side of the aluminum cooling element to improve cooling.

In addition to the operation of the frame structure described above, the present structure is characterized by a simple modifiable solution which significantly simplifies the configuration of the device in view of cooling solutions and improves the cooling of the elements.

BRIEF DESCRIPTION OF THE FIGURES

One preferred embodiment of the invention is shown in the attached drawing presenting a cooling solution for an adjustable drive in a frame structure.

DETAILED DESCRIPTION OF PREFERRED EMBODIMENTS

FIGS. 1 to 5 show one embodiment in which a cooling element 2 is fixed to an aluminum profile base 1 and this combination serves as the support base for the entire device.

Figure 1:
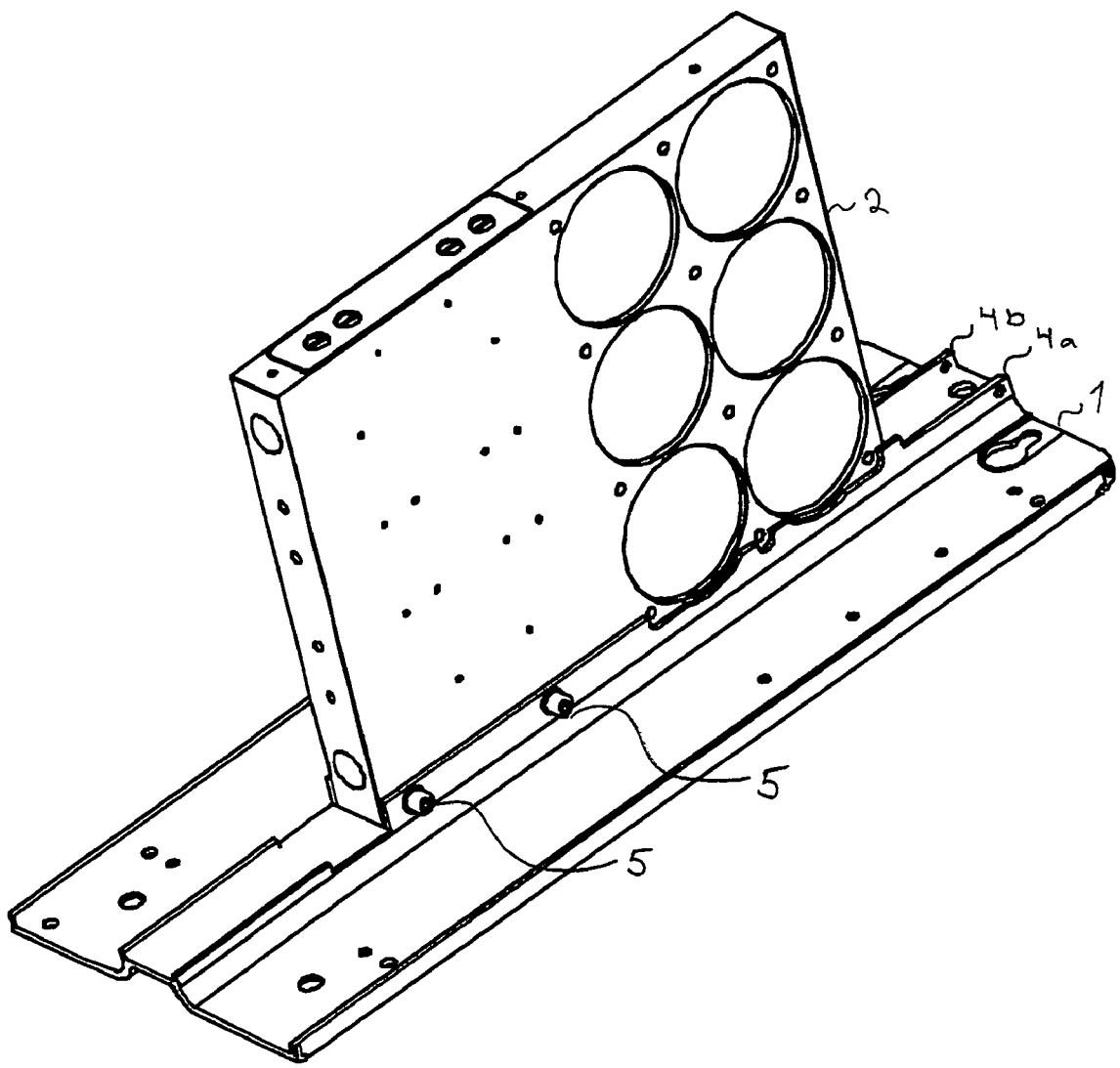
FIG. 1 shows obliquely from the top a cooling element fastened vertically to its base.
Figure 3:
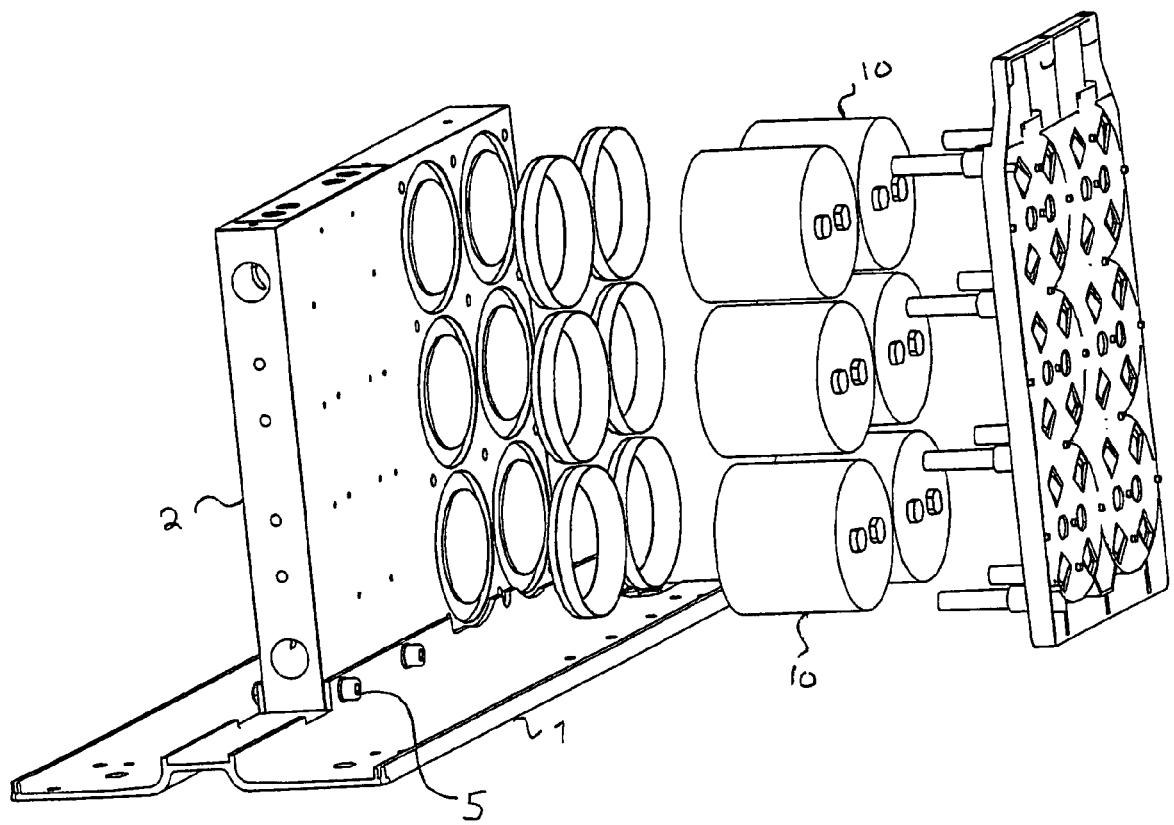
FIG. 3 is a direct side view of a cooling element fastened vertically to its base and having capacitors to be cooled fastened to it.

The base 1 is made of an aluminum profile, for instance, which is stiffened and has mounting rails 4a and 4b for receiving the cooling element 2 and for supporting it from the sides. The stiffened section may be, as shown in FIGS. 1 and 3, in the middle of the base, but it may also be on the sides of the base 1, for instance. The length of the mounting rails 4a and 4b may vary so that the cooling element 2 is longer or shorter than the mounting rails 4a and 4b. Longer mounting rails make it possible to fasten cooling elements of different sizes to the same base 1.

Figure 2:
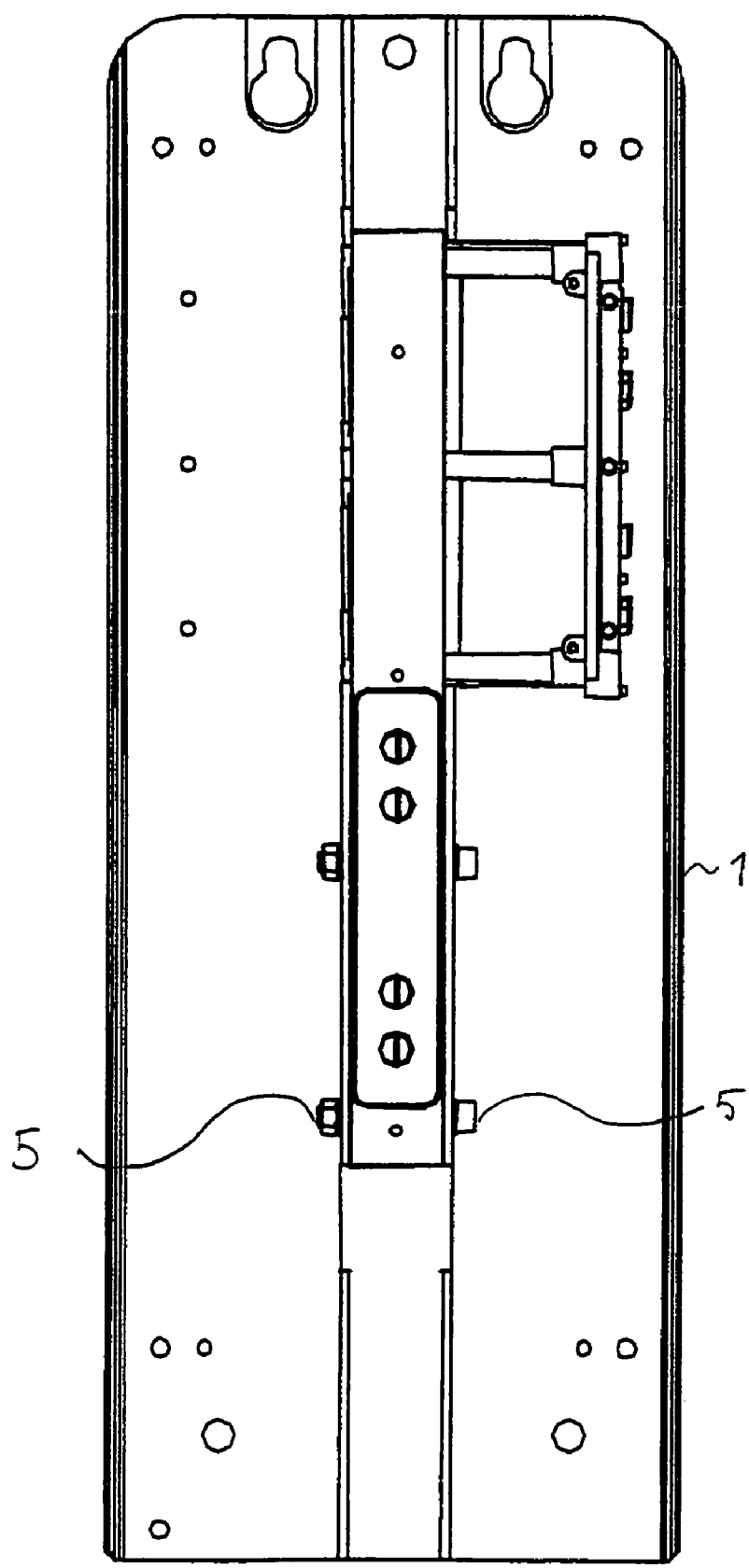
FIG. 2 is a direct top view of a cooling element fastened vertically to its base and having capacitors to be cooled fastened to it.

The cooling element 2 is cooled by liquid and it is fastened, as shown in FIG. 2, perpendicularly to the profile base 1 by means of fastening means 5 that support the cooling element so that components can be fastened on both side surfaces of the cooling element 2.

The cooling element can be fastened between the mounting rails 4a and 4b on the base, whereby the combined base and cooling element serve as a heat-conducting support base structure of the frequency converter, because the base is also made of a heat-conducting material, such as aluminum. The base 1 and the mounting rails 4a and 4b arranged thereto adapt closely to the cooling element and this closeness also allows heat to transmit from the cooling element to the base thus also making the base serve as an extension part for the cooling element. Heat transmission from the cooling element to the base can be further improved by using heat-conducting paste between the base 1 and cooling element 2.

The cooling element can also be fastened with screw-like means to the base 1 from below (not shown).

The cooling element 2 can be made as large as possible by using it as a part of the support base of the frequency converter and by also fastening thereto any parts that do not require as much cooling, such as the capacitors 10 shown in FIG. 3. The large cooling element 2 of FIGS. 1 and 3 enables the positioning of components as desired. The size and shape of the cooling element may vary, but the planar surfaces should be straight so that elements can be fastened tightly to the surfaces.

Figure 4:
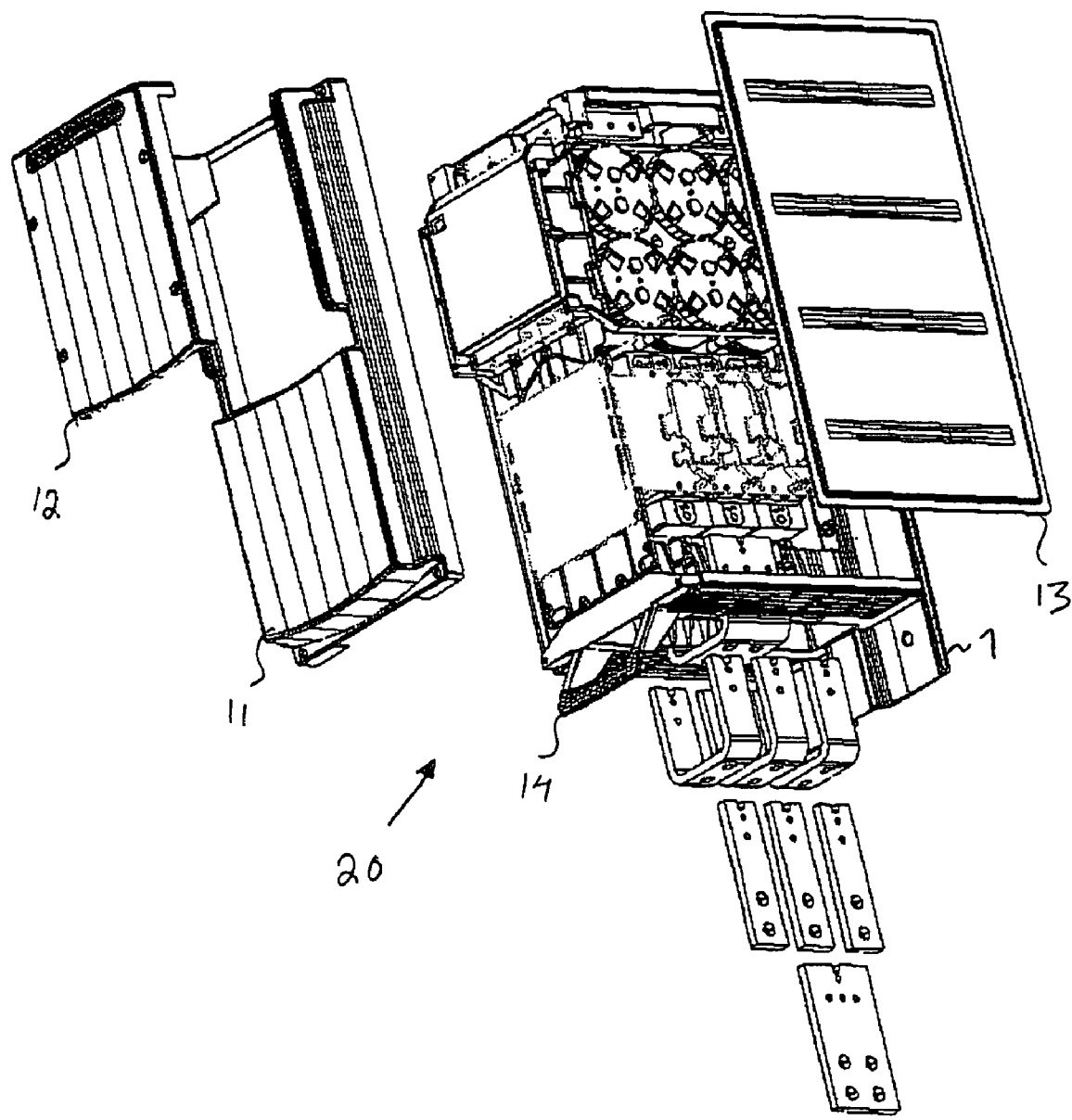
FIG. 4 shows obliquely from the top a partial view of a frequency converter to which parts of a casing can be attached.
Figure 5:
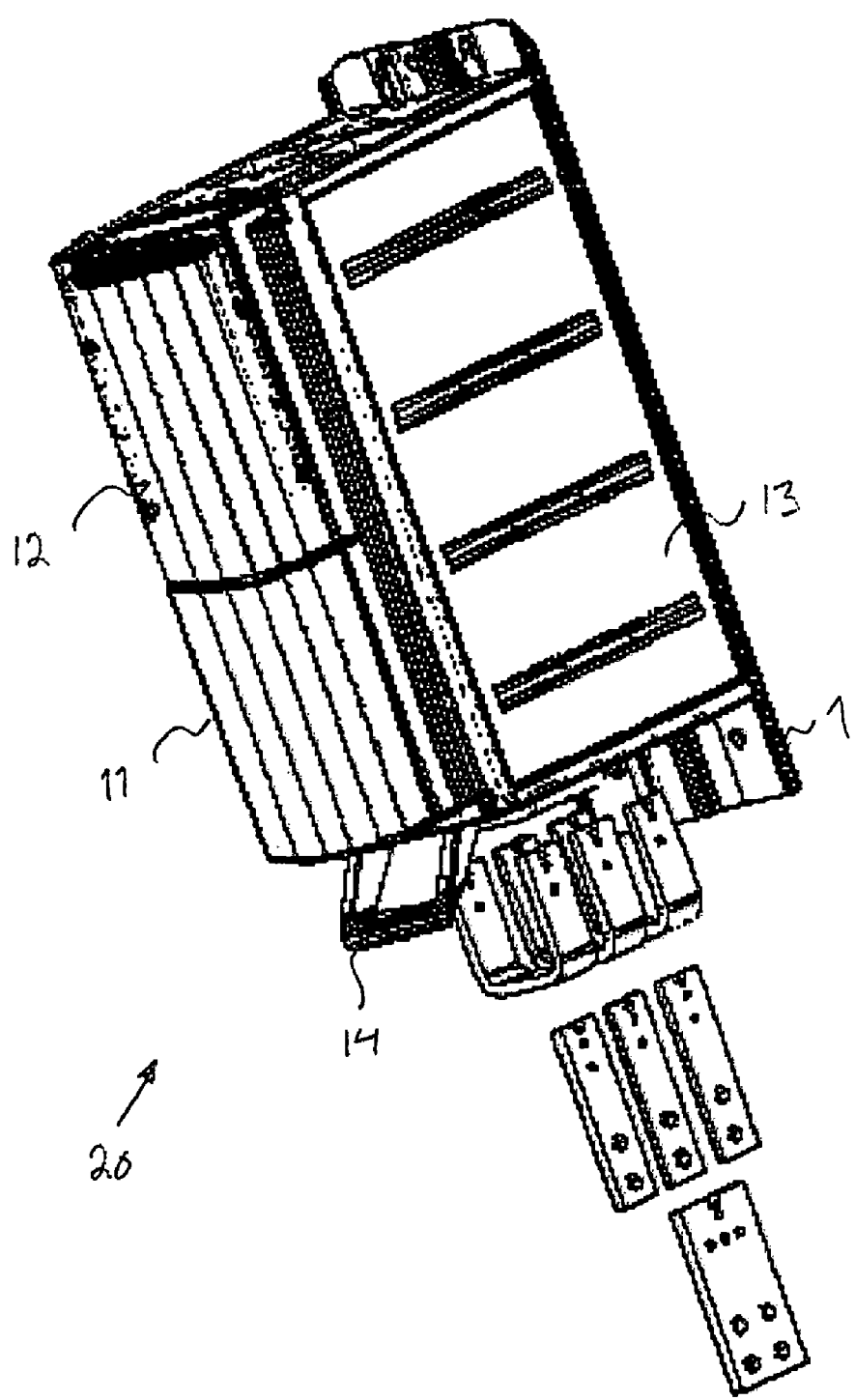
FIG. 5 shows obliquely from the top the frequency converter of FIG. 4 when encased.

FIGS. 4 and 5 show an assembled frequency converter 20. The location of the frequency converter elements can be freely altered, since all covers 11, 12, 13, 14 can be made detachable for maintenance, for instance.

It should be understood that the above description and the related figures are only intended to illustrate the present invention. The invention is thus not limited to what is stated above or to the embodiment defined in the claims, but many different variations and modifications of the invention, which are possible within the scope of the inventive idea defined in the attached claims, will be apparent to persons skilled in the art.

The invention claimed is:

1. A cooling arrangement for an adjustable electric drive, especially in the structure of an encased frequency converter, the arrangement comprising:
   a base having a means for fastening the cooling element, and
   an aluminum cooling element installed in a vertical position to the base by a fastening means,
   wherein
   the base is an aluminum profile which is profiled such that it has mounting rails between which said cooling element is installed parallel to said mounting rails
   whereby the combined base and cooling element serve as a heat-conducting support base of the frequency converter.

2. A cooling arrangement as claimed in claim 1, wherein the cooling element can be fastened to a middle of the base so that heat-generating elements can be fastened to side surfaces of the cooling element.

3. A cooling arrangement as claimed in claim 2, wherein the cooling element is sufficiently large so that all components of the frequency converter can be fastened to sides of the cooling element.

4. A cooling arrangement as claimed in claim 1, wherein the mounting rails are arranged to a stiffened section of the base.

* * * * *